(12) United States Patent
Riccioni (10) Patent No.: US 6,198,297 B1
(45) Date of Patent: Mar. 6, 2001

(54) MICROCIRCUIT TESTING DEVICE

(75) Inventor: Roberto Riccioni, Rome (IT)

(73) Assignee: Padar Technologie di Riccioni Roberto S.a.s., Rome (IT)

( * ) Notice: Subject to any disclaimer, the term of this patent is extended or adjusted under 35 U.S.C. 154(b) by 0 days.

(21) Appl. No.: 09/200,771

(22) Filed: Nov. 30, 1998

(30) Foreign Application Priority Data

Dec. 12, 1997 (EP) .................................................. 97830659

(51) Int. Cl.⁷ .................................................. G01R 31/02
(52) U.S. Cl. ......................... 324/754; 324/761; 324/765
(58) Field of Search .................................. 324/754, 758, 324/761, 765; 439/482

(56) References Cited

U.S. PATENT DOCUMENTS

| | | | |
|---|---|---|---|
| 3,611,128 | * 10/1971 | Nagata | 324/72.5 |
| 4,599,559 | * 7/1986 | Evans | 324/754 |
| 5,317,255 | * 5/1994 | Suyama et al. | 324/754 |
| 5,550,480 | * 8/1996 | Nelson et al. | 324/754 |
| 5,635,846 | * 6/1997 | Beaman et al. | 324/754 |

FOREIGN PATENT DOCUMENTS

| | | |
|---|---|---|
| 87 01 195 | 5/1987 | (DE) . |
| 87 13 754 | 2/1988 | (DE) . |
| 0 708 338 | 4/1996 | (EP) . |

* cited by examiner

*Primary Examiner*—Safet Metjahic
*Assistant Examiner*—Anjan K Deb
(74) *Attorney, Agent, or Firm*—Guido Modiano; Albert Josif; Daniel O'Byrne (57) ABSTRACT

A microcircuit testing device, comprising an element for supporting a plurality of probes which are meant to make contact with pads of microcircuits to be tested which are formed on a wafer, the probes being directed substantially vertically to the supporting element, and connection elements suitable to connect ends of the probes, which are arranged opposite to ends for contact with the pads, to an element for providing an electrical interface between the connection elements and electric connector elements.

19 Claims, 7 Drawing Sheets

MICROCIRCUIT TESTING DEVICE

BACKGROUND OF THE INVENTION

The present invention relates to a microcircuit testing device.

More particularly, the device relates to a device for testing integrated circuits, or microcircuits, and particularly to methods for manufacturing devices whereby said integrated circuits, before splitting a silicon wafer, are placed in electrical contact with the testing device.

It is known that the devices commonly used to test a silicon wafer by connecting simultaneously all the pads of the microcircuit to the device, commonly known as probe cards, are constituted by a printed circuit board having variable shapes and complexities, which is provided with a hole also having various shapes and into which elastic metallic needles, known as probes, protrude, the tip of said needles making contact with a pad of the microcircuit.

Automatic alignment and movement systems ensure that each microcircuit that is present on the silicon wafer is sequentially arranged so as to face the hole of the probe card and is moved towards it, so that each probe tip makes contact with the respective pad.

Among the various probe assembly systems of the prior art, the one most widely used for applications with a high density of probes per microcircuit is disclosed by U.S. Pat. Nos. 3,835,381 and 3,905,098 in the name of Garretson et al and is duplicated with minor variations in other documents.

This system provides for probes made of tungsten or copper-beryllium or other conducting materials, arranged so as to form a radiating array along the generatrices of a frustum-shaped ring whose apex angle is almost flat; the tips of said needles are directed towards the center of the ring and bent downward. The probe supporting ring is usually made of materials which are as temperature-stable as possible, in order to allow maximum positioning constancy for the probe tips.

The probes are locked in position by pouring a resin which also has the best possible characteristics in terms of thermal stability and electrical insulation.

Conventional microcircuit testing devices, however, are affected by some drawbacks which are described hereinafter.

Use of a printed circuit board as a support for the probe supporting ring entails problems in terms of limited mechanical rigidity which are inherent in the material, which is usually epoxy resin embedding a mat of glass fiber.

Moreover, the conventional almost-horizontal arrangement of the needles, i.e., approximately parallel to the probe card, has some shortcomings if simultaneous probing of a plurality of microcircuits is required.

Figure 1:
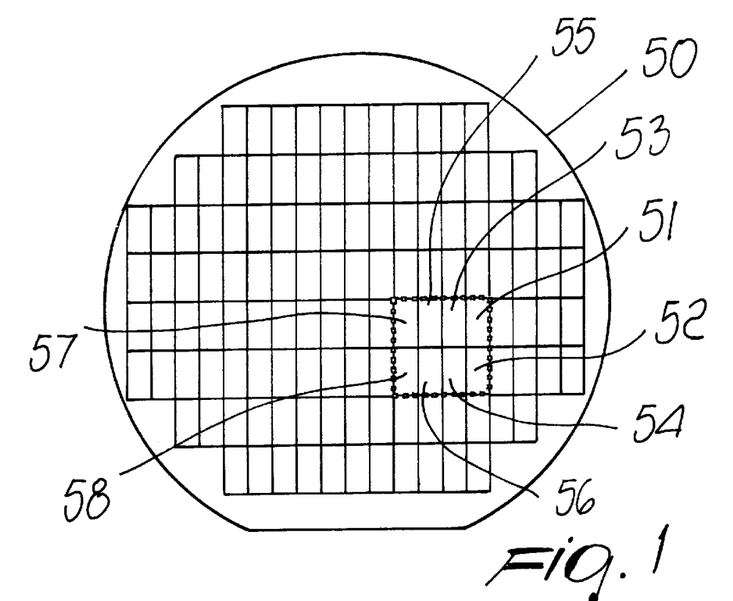
FIG. 1 is an example view of a silicon wafer on which microcircuits are arranged.

This is particularly necessary for example in the testing of memory microcircuits, in which case it is necessary to probe two, four or more columns, each bearing four, eight or more microcircuits arranged side by side, as shown schematically in FIG. 1, which illustrates by way of example the simultaneous probing of four columns, each composed of two microcircuits.

In FIG. 1, the reference numeral 50 designates a silicon wafer and the reference numerals 51/52, 53/54, 55/56 and 57/58 designate respectively the pairs of microcircuits arranged side by side which must be tested by the testing device.

Figure 2:
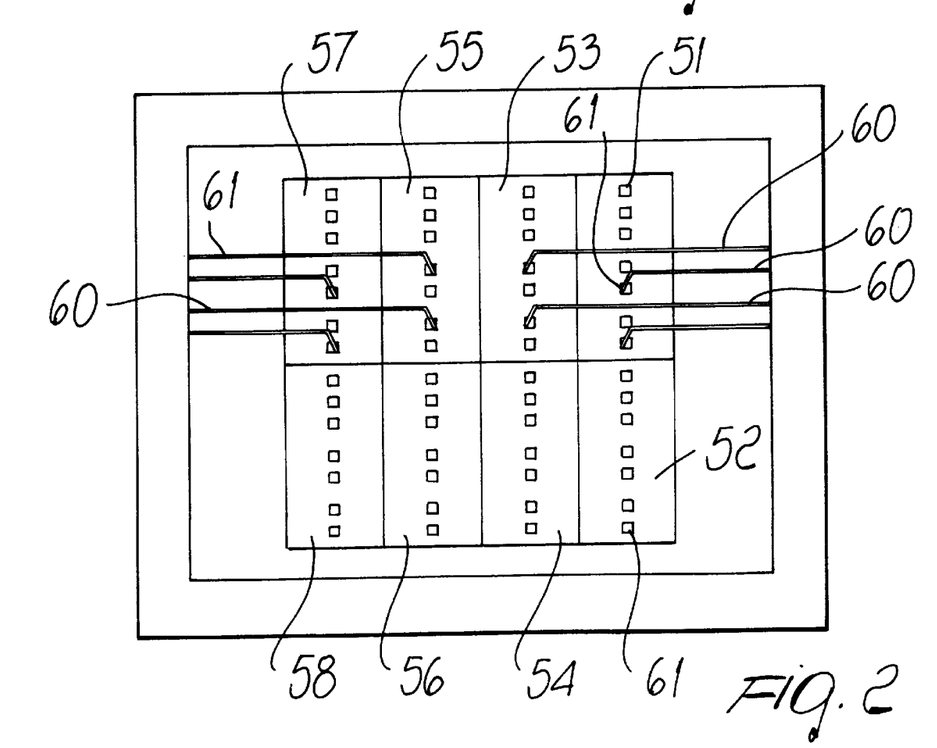
FIG. 2 is a view of a detail of FIG. 1, illustrating four pairs of microcircuits with probes arranged on their contact pads, according to a known method.

Also in the most favorable case, in which each microcircuit has contact pads arranged along a single median row, as shown in FIG. 2, which is an enlarged-scale detail view of the four pairs of microcircuits shown in FIG. 1, with the probes designated by the reference numeral 60, which make contact with respective pads, designated by the reference numeral 61, of the microcircuits arranged side by side, the probe system with horizontal needles (probes 60) limits to two the number of columns that can be contacted. If one wishes to access more than one row of pads 61 from either side of the ring, the difference in length of the probes between one row and the next would have to be approximately equal to the pitch between the columns, producing needles 60 having considerably uneven lengths, with a great difference in the elastic contact forces, making it therefore impossible to obtain uniform contact resistances among the probes 60.

SUMMARY OF THE INVENTION

The aim of the present invention is therefore to provide a microcircuit testing device which allows access to a plurality of parallel columns by means of suitably supported probes.

Within the scope of this aim, an object of the present invention is to provide a microcircuit testing device in which the needles of the probes are shaped so as to simultaneously make contact with any number of microcircuits.

Another object of the present invention is to provide a microcircuit testing device in which the length differences of the elastic part among the probes become negligible, allowing substantially equal pressures.

Another object of the present invention is to provide a microcircuit testing device in which the electric circuit is standardized, so as to make it independent of the shape of the support.

Another object of the present invention is to provide a microcircuit testing device which is highly reliable, relatively easy to manufacture and at competitive costs.

This aim, these objects and others which will become apparent hereinafter are achieved by a microcircuit testing device, characterized in that it comprises an element for supporting a plurality of probes which are meant to make contact with pads of microcircuits to be tested which are formed on a wafer, said probes being directed substantially vertically to said supporting element, and connection means suitable to connect ends of said probes, which are arranged opposite to ends for contact with said pads, to an element for providing an electrical interface between said connection means and electric connector means.

BRIEF DESCRIPTION OF THE DRAWINGS

Further characteristics and advantages of the invention will become apparent from the description of a preferred but not exclusive embodiment of the device according to the invention, illustrated only by way of non-limitative example in the accompanying drawings, wherein.

DESCRIPTION OF THE PREFERRED EMBODIMENTS

In all the figures, identical elements are designated by identical reference numerals.

FIGS. 1 and 2 are not described hereinafter, since they have already been explained.

With reference to FIGS. 3 to 13, the microcircuit testing device according to the present invention comprises a supporting plate 1, to which a probe supporting block 2 is fixed; the tips of probes 3 protrude from the lower part of the block and are meant to make contact with a silicon wafer on which the microcircuit to be tested is arranged.

Figure 3:
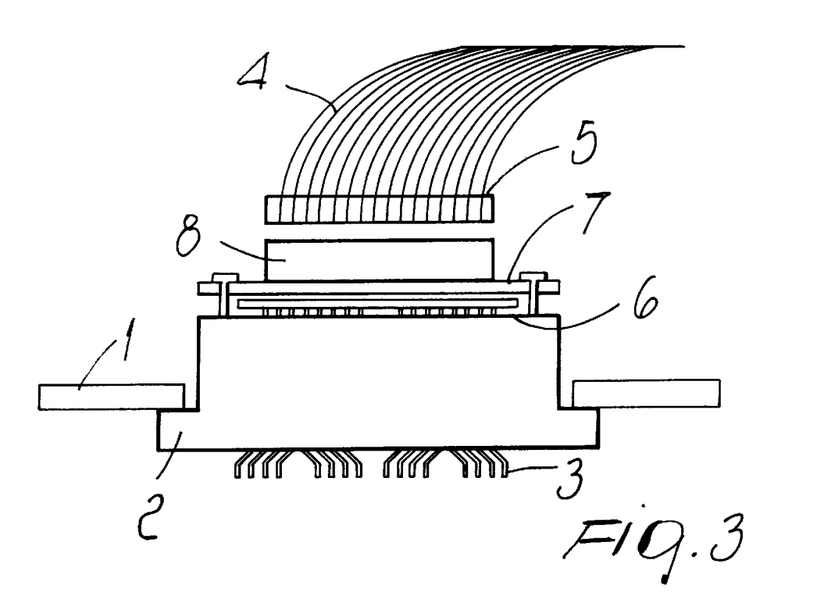
FIG. 3 is a general view of a probe card executed according to the present invention.
Figure 4:
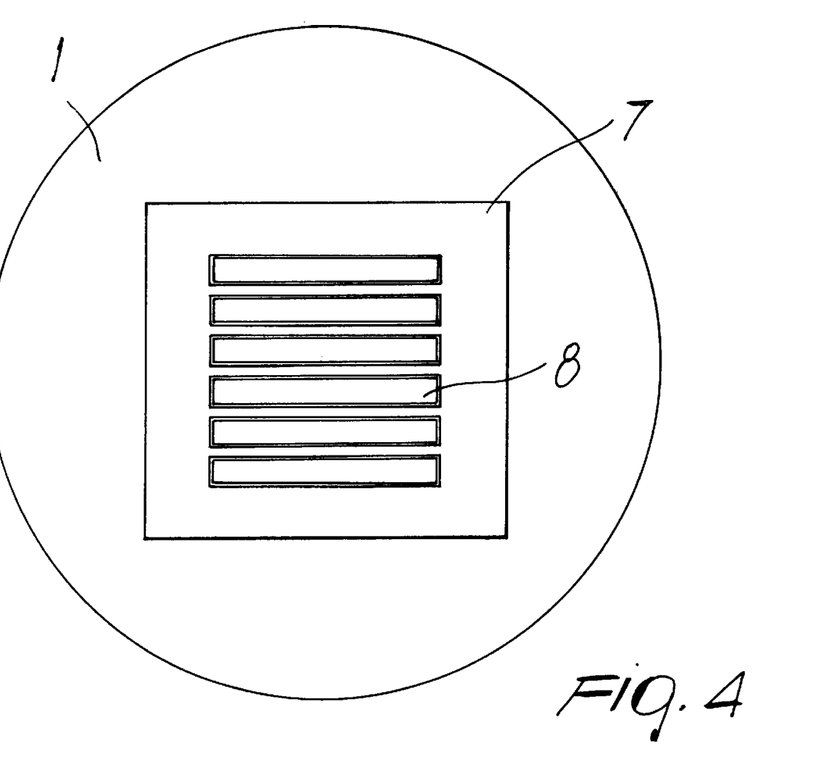
FIG. 4 is a general plan view of a probe card according to the present invention.

The rear ends of the probes 3 protrude from the upper part of the probe supporting block 2 which is opposite to the part from which the tips of the probes protrude; said rear ends must be connected electrically to multipolar flat coaxial cables 4 which are terminated on conventional female multipolar connectors 5.

For this purpose, there are conveniently provided connection means 6, a multilayer element 7 and multipolar plug connectors 8 arranged on the multilayer element 7.

The various components of the microcircuit testing device according to the invention are now described individually in detail.

The supporting element 1, which is of the plate type, is made of a machinable ceramic material, for example a material known in the industry by the trade-name MACOR, or alternatively of a metal alloy featuring high dimensional stability with respect to temperature variations, known commercially as KOVAR, whose thickness is adequate for the mechanical stresses produced by the pressure of the probe card on the wafer on which microcircuits to be tested are arranged.

In the intended applications the card in fact also supports a few thousand probes 3 with a total contact pressure of tens of kilograms.

In these conditions, the supporting plate 1 must maintain a rigidity which is sufficient to keep the set of probes 3 in the correct position with respect to the points where the card rests on the contact testing machine, with tolerances of a few microns.

The shape of the supporting plate 1 and of its points of mechanical interfacing with the contact testing machine depend of course on the configuration of said machine.

Figure 5:
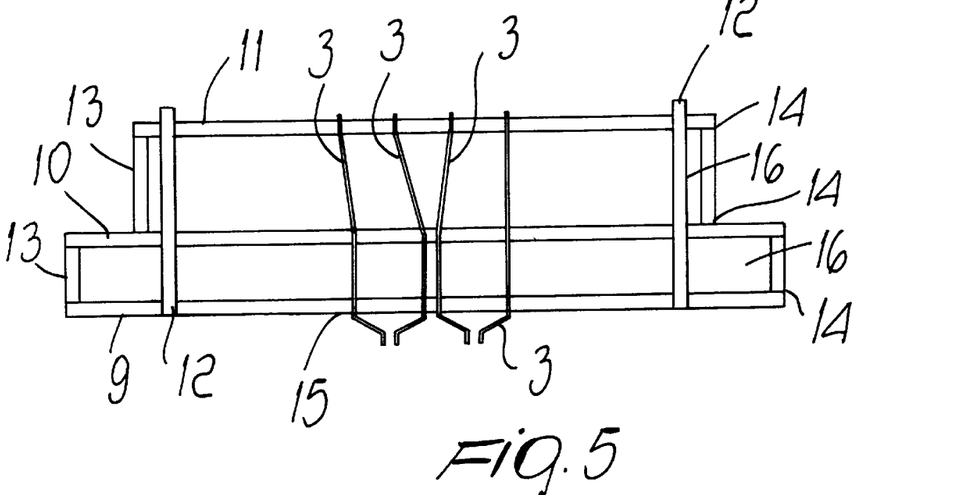
FIG. 5 is a general sectional view of the probe supporting block executed according to the present invention.
Figure 7:
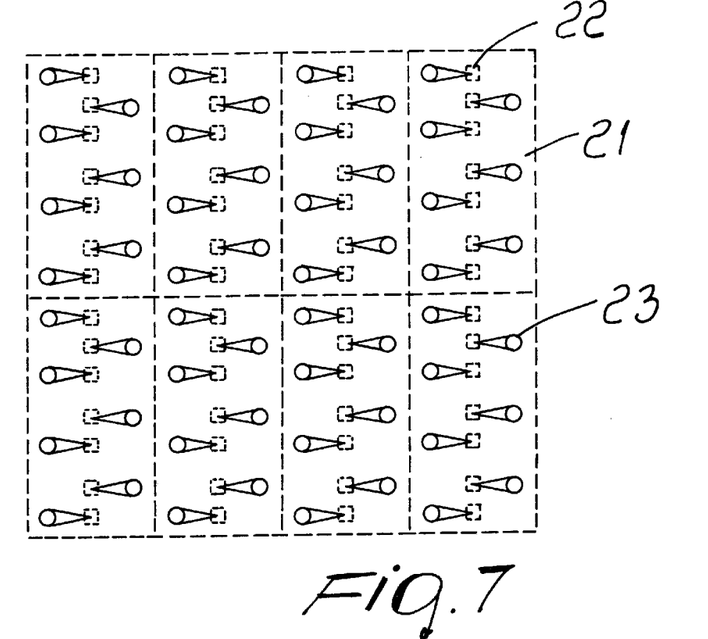
FIG. 7 is an example view of an access to the eight microcircuits, already considered in FIG. 2, by means of the device executed according to the present invention.
Figure 8:
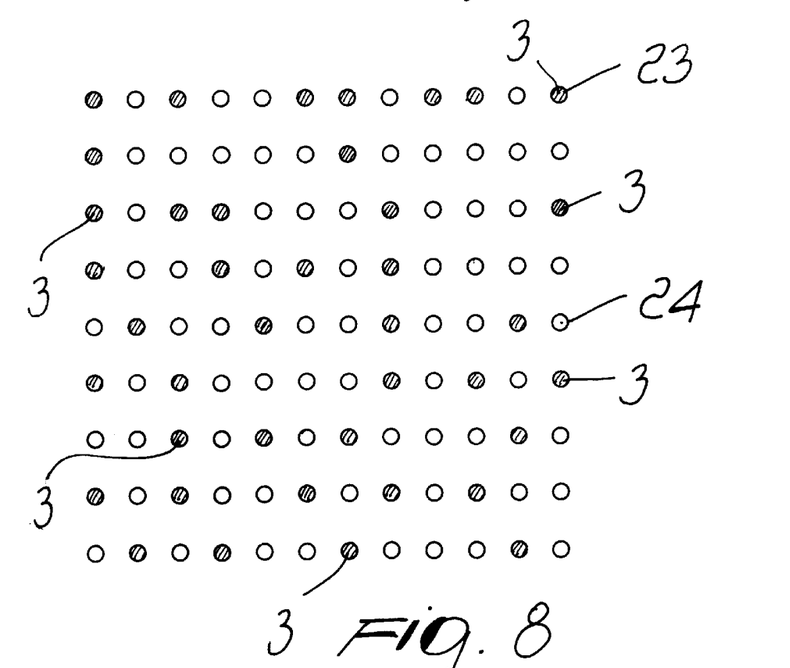
FIG. 8 is a view of a detail of the device according to the present invention, shown in FIG. 5.

The probe supporting block 2, shown in detail in FIG. 5, is composed of a parallelepiped-shaped box constituted by three superimposed spacers 9, 10 and 11, made of machinable ceramic, which are perforated as shown in FIGS. 7 and 8, are arranged in register by means of pins 12 which interconnect the three spacers, and are completed by side walls 13 that are glued by means of acrylic adhesive 14.

The probes 3 are inserted in the holes of the spacers; said probes are shown in detail, according to an exemplifying embodiment, in FIG. 6 and are described hereinafter.

The probes 3 are kept in position during assembly by means of a radiation-activated adhesive 15 and then permanently positioned by means of an embedding material 16 (of the insulating type).

FIG. 7 illustrates in detail the perforation of the spacers 9 and 10, while FIG. 8 illustrates the detail of the perforation of the spacer 11.

FIG. 7 illustrates the exemplifying case of an access to eight microcircuits 21 arranged side by side in pairs, each provided with seven pads, designated by the reference numeral 22, aligned in a median position.

Alternating access from the left and from the right to said pads is chosen, using probes 3 whose vertically directed rear end is inserted in the holes 23.

The position of said holes is thus determined by the position of the pads 22 and by the orientation of the horizontal part of the respective probes 3.

FIG. 8, as mentioned, instead illustrates the standard perforation grid of the spacer 11, in which some holes 23 are occupied by probes 3 and other holes 24 are empty.

Between the spacer 10 and the spacer 11, the probes 3 therefore undergo bending in order to have a uniform arrangement on the upper surface of the box-like element that constitutes the probe supporting block 2.

Figure 11:
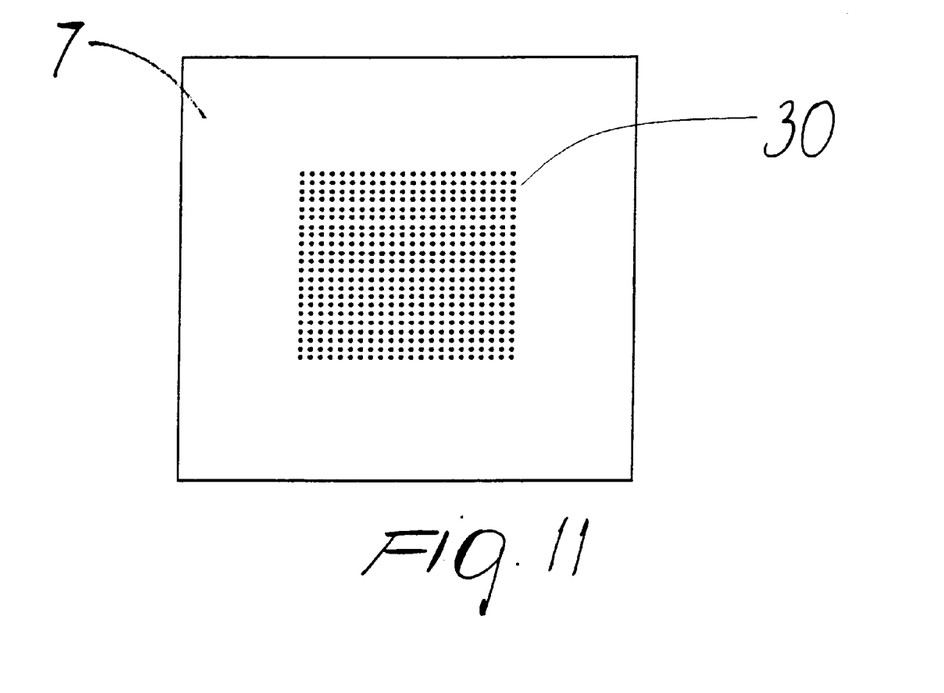
FIG. 11 is a view of the lower face of an element of the device according to the present invention.

This arrangement is an exact duplicate of the arrangement configured on the lower face of the multilayer element 7, described hereinafter.

Figure 6:
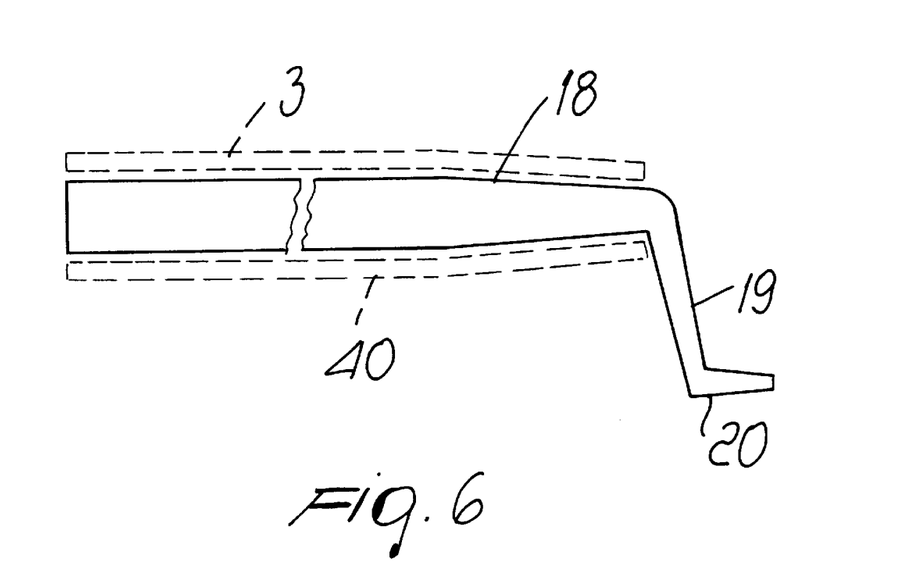
FIG. 6 is a schematic view of an example profile of a probe used in the device according to the invention.

FIG. 6 illustrates a typical profile of a probe 3 of the double-bend type, used to access the wafer vertically, constituted by conventional materials.

The sum of the lengths of the rear end 18 of the probe and of the descending portion 20 is determined so as to make the rear end of the probe protrude from the upper surface of the probe supporting block 2, in order to produce a correct contact with the connection means 6 described hereinafter.

The length of the cantilevered portion 19 and of the descending portion 20 are also determined according to the distribution of the pads 22 of the microcircuit to be tested.

Figure 9:
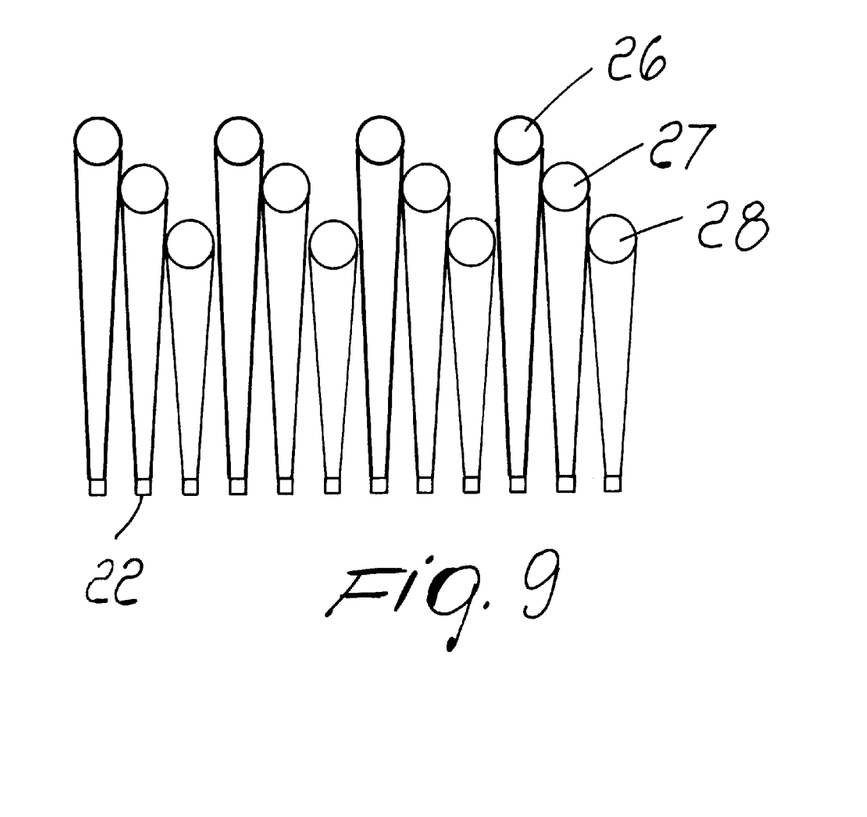
FIG. 9 is a plan view of another example of access to microcircuit pads, by means of probes of the device according to the present invention, if the pads are very close.

In fact, in the case shown in FIG. 9, the pads 22 are very close to each other and it is necessary to access them from different levels or planes by suitably combining the length of the three elements 18, 19 and 20 that compose each probe 3, so that access to the wafer, designated here by the reference numeral 29, is possible along different planes in which the probes 3 lie.

Figure 10:
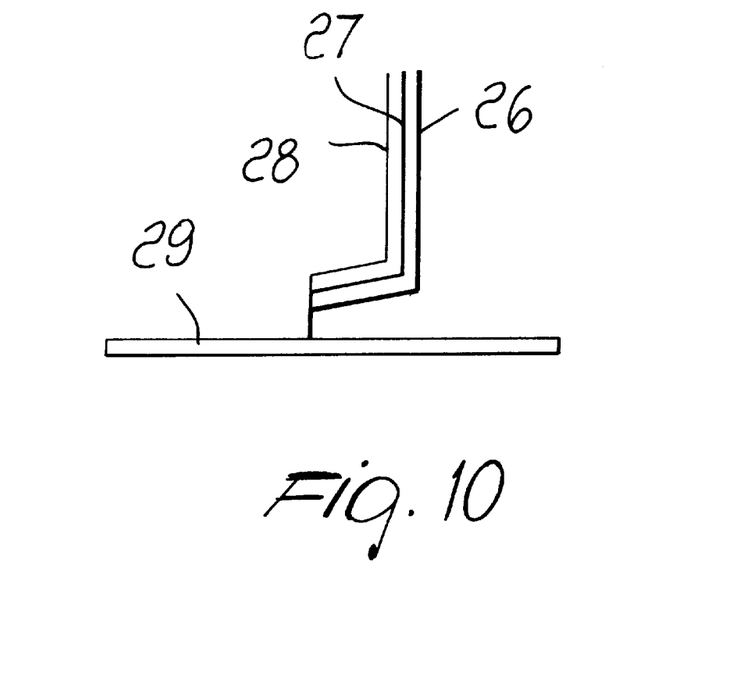
FIG. 10 is an elevation view of example shapes of probes which can be used in the device according to the present invention, when applied to an example of access to microcircuit pads as shown in FIG. 9.

Therefore, FIG. 10 shows that three different configurations of probes 26, 27 and 28 are indispensable; each configuration provides one of the above-described probes, and the difference among the three different probes lies in the length of the cantilevered portions 19.

The elastic contact forces of the probes 3 against the wafer 29 should be considered to be particularly equal, since the cantilevered portions 19 have very small mutual differences.

Figure 13:
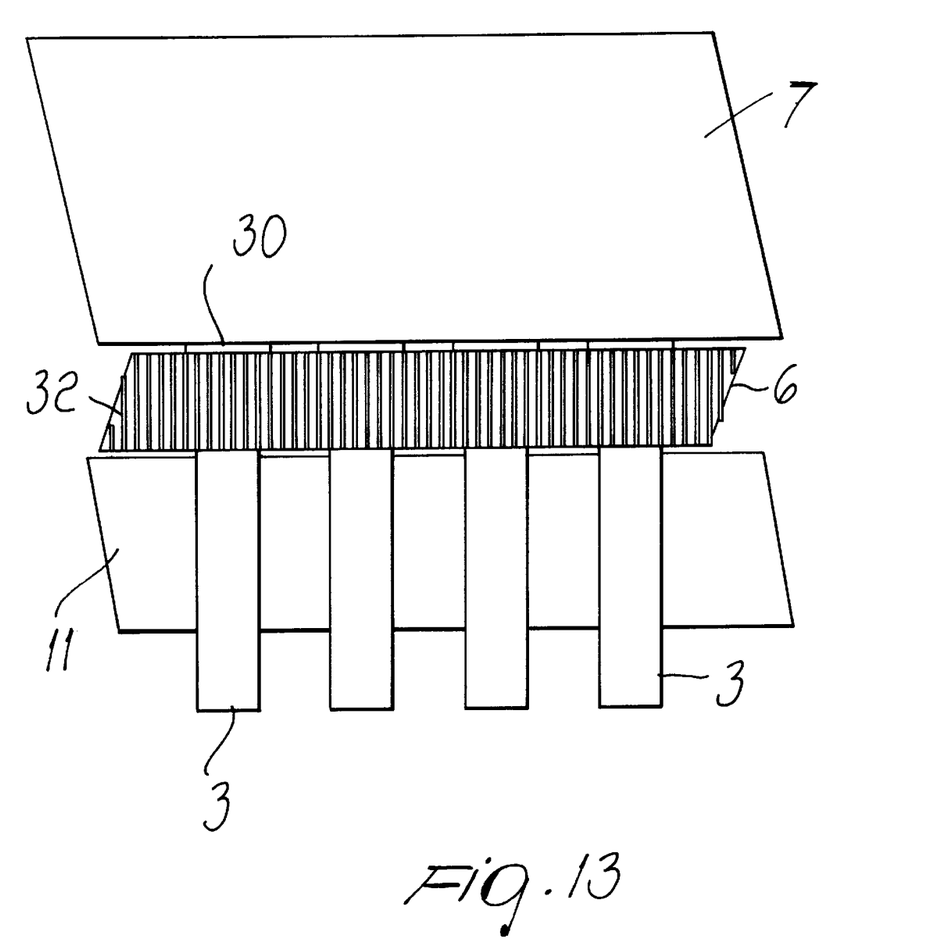
FIG. 13 is an enlarged-scale sectional view of the electrical coupling provided between the opposite end of the probes and the pads of a multilayer element in the device according to the present invention.

The connection means 6 are shown in greater detail in FIG. 13, which illustrates the rear ends of the probes 3 which protrude from the upper face of the spacer 11 which constitutes the top of the probe supporting block 2.

The connection means have the purpose of electrically connecting the upper face of the probe supporting block 2 to the lower face of the multilayer element 7.

FIG. 13 is a highly enlarged sectional view of the electrical coupling performed by the connection means 6 between the probes 3 and the pads 30 formed on the lower face of the multilayer element 7, described in detail hereinafter.

Said connection means are provided by an elastomeric sheet of insulating silicone, which is crossed from side to side by a plurality of conductors 32 arranged substantially parallel to each other and at right angles to the faces of the connecting means, which have a very small diameter and are arranged with a constant pitch. Said conductors 32 produce univocal and reliable contact between the end part of the rear portion of the probes 3, which protrudes from the spacer 11, and the respective pad 30 formed on the lower surface of the multilayer element 7.

The multilayer element 7 has, as mentioned, on its lower face, pads 30 which are shown in a bottom plan view in FIG. 11.

The pads 30 arranged on the lower face of the multilayer element 7 are provided so as to form a grid, which in this case is substantially rectangular and is identical to the grid provided on the upper face of the probe supporting block 2, and specifically on the upper face of the separator element 11, a portion whereof is illustrated in FIG. 8 by way of example.

Figure 12:
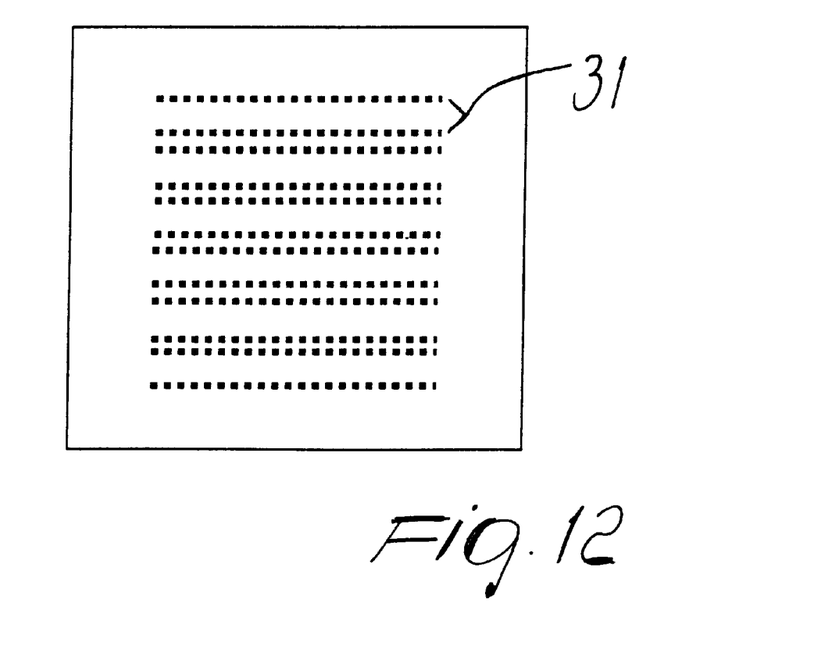
FIG. 12 is a view of the upper face of the element shown in FIG. 11.

FIG. 12 instead illustrates the upper face of the multilayer element 7, clearly showing the recesses 31 of the soldering pins of the multipolar plug-and-socket connectors 8.

The multilayer element 7 is capable of connecting any pad 30 to any recess 31.

The multilayer element 7 is provided by means of the conventional method for producing printed circuits with a high connection density.

In the very frequent case in which it is necessary to process high-frequency signals, the multilayer element 7 is provided with methods for controlling the characteristic impedance of the circuit traces.

In practice, it has been observed that the device according to the invention fully achieves the intended aim and objects, since it allows to separate the probe supporting function from the electrical interface function. The mechanical supporting function is thus entrusted to a plate made of ceramic material or of special metal alloy, which ensures high stability with respect to temperature variations, which are frequently required by the testing specifications of microcircuits arranged on a silicon wafer.

Access to multiple parallel columns of microcircuit pads is allowed by needle probes shaped with a double bend having a vertical orientation, which can be arranged so as to simultaneously contact any number of microcircuits on the wafer.

In this manner, the differences in length of the elastic part, constituted by the substantially Z-folded portion between one probe and the next, become negligible, allowing substantially identical pressures among the various probes and the pads of the microcircuits to be tested.

The probe supporting function is entrusted, as mentioned, to a ceramic block provided with vertical holes, in which the probes are inserted and locked one by one and are thus locked collectively by means of the embedding material.

The electrical circuit function for the routing of the signals from and to the testing instruments is provided by a silicone elastomer sheet which conducts only along the Z axis and by a multilayer printed circuit board, termed herein multilayer element, which is separate from the mechanical support, thus achieving the dual advantage of being able to standardize the circuit, making it independent of the shape of the supporting element, and of thus allowing to assign the input/output connection to each probe with the greatest freedom.

The device thus conceived is susceptible of numerous modifications and variations, all of which are within the scope of the inventive concept; all the details may also be replaced with other technically equivalent elements.

Thus, for example, the holes of the spacer 10 can be slightly offset with respect to the holes of the spacer 11 in order to facilitate the insertion of the probes in the spacer 11.

Moreover, since if the chips to be tested have a high operating frequency noise problems arise which affect the signals that flow through the probes and increase in significance as the path that said signals must follow increases in length, it is accordingly necessary to provide probe shielding means which can be constituted for example by tubes 40 made of insulating material, arranged around the straight portion of the probes. In this case, instead of using an insulating embedding material, a conducting embedding material is used in order to keep the probes in position.

In practice, the materials employed, so long as they are compatible with the specific use, as well as the dimensions, may be any according to requirements and to the state of the art.

The disclosures in European Patent Application No. 97830659.5 from which this application claims priority are incorporated herein by reference.

What is claimed is:

1. A microcircuit testing device, comprising an element for supporting a plurality of probes which are meant to make contact with pads of microcircuits to be tested which are formed on a wafer, said probes being directed substantially vertically to said supporting element, and connection means suitable to connect ends of said probes, which are arranged opposite to ends for contact with said pads, to an element for providing an electrical interface between said connection means and electric connector means, said probes being Z-shaped.

2. The device according to claim 1, wherein said probes have a profile with a double curve which comprises two mutually parallel and offset portions connected by an oblique portion.

3. The device according to claim 2, wherein the ends of said probes which are opposite to the ends for contact with said pads protrude from the top of a probe supporting element which is supported by said supporting element.

4. The device according to claim 3, wherein said probes are arranged substantially vertically in said probe supporting element and are kept in position therein in a fixed manner.

5. The device according to claim 4, wherein said probe supporting element is constituted by a first spacer, a second spacer and a third spacer which are mutually parallel and connected by means of connecting elements, said probes protruding with their contact ends from the lower surface of said first spacer and with their opposite ends from the upper surface of said third spacer.

6. The device according to claim 5, wherein said connecting means comprise an elastomer sheet of insulating material which is crossed by a plurality of conductors for electrical connection between the ends of said probes and said electrical connector means, said elastomer sheet being detachable from said electrical connector means and from the ends of said probes.

7. The device according to claim 6, wherein said electrical interface element comprises a multilayer element having, on its lower face, a plurality of pads arranged in a configuration which is similar to the configuration of pads formed on the upper face of the third spacer from which the ends of said probes protrude.

8. The device according to claim 7, wherein the upper surface of said multilayer element connects said pads formed on the upper face of said third spacer to said electrical connector means.

9. The device according to claim 8, wherein said multilayer element is constituted by a printed circuit.

10. The device according to claim 1, wherein said supporting element comprises a plate made of ceramic material.

11. The device according to claim 1, wherein said supporting element comprises a plate made of metal alloy.

12. The device according to claim 5, wherein said first, second and third spacers that constitute said probe supporting element are made of ceramic.

13. The device according to claim 2, wherein said probes have oblique portions of different lengths.

14. The device according to claim 5, wherein said first, second and third spacers are perforated in order to position said probes.

15. The device according to claim 14, wherein the holes of said second and third spacers are mutually axially aligned.

16. The device according to claim 14, wherein the holes of said second and third spacers are mutually offset.

17. The device according to claim 1, wherein said probes are inserted in tubes made of insulating material.

18. The device according to claim 14, wherein said probes are temporarily locked in said spacers by means of a radiation-activated adhesive.

19. The device according to claim 16, wherein said probes are locked in said spacers by means of an electrically conducting embedding material.

* * * * *